United States Patent
Kamikura et al.

(10) Patent No.: US 9,646,927 B2
(45) Date of Patent: May 9, 2017

(54) POWER SEMICONDUCTOR DEVICE

(71) Applicant: MITSUBISHI ELECTRIC CORPORATION, Chiyoda-ku (JP)

(72) Inventors: Mamoru Kamikura, Chiyoda-ku (JP); Keita Takahashi, Chiyoda-ku (JP); Nobuyuki Haruna, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/111,864

(22) PCT Filed: Dec. 1, 2014

(86) PCT No.: PCT/JP2014/081687
§ 371 (c)(1),
(2) Date: Jul. 15, 2016

(87) PCT Pub. No.: WO2015/133024
PCT Pub. Date: Sep. 11, 2015

(65) Prior Publication Data
US 2016/0336268 A1    Nov. 17, 2016

(30) Foreign Application Priority Data
Mar. 6, 2014    (JP) .................................. 2014-043417

(51) Int. Cl.
*H01L 23/34* (2006.01)
*H01L 23/522* (2006.01)
(Continued)

(52) U.S. Cl.
CPC ...... *H01L 23/5225* (2013.01); *H01L 23/3114* (2013.01); *H01L 23/3121* (2013.01);
(Continued)

(58) Field of Classification Search
CPC . H01L 23/36; H01L 23/4334; H01L 23/3675; H01L 23/3672; H01L 23/3677
(Continued)

(56) References Cited

U.S. PATENT DOCUMENTS 7,633,143 B1 *  12/2009  Fan ................... H01L 23/49503
                                                      257/666
2010/0027184 A1 *  2/2010  Chen ................... H05K 9/0067
                                                      361/220

FOREIGN PATENT DOCUMENTS

JP          10-56131 A      2/1998
JP       2009-268165 A     11/2009
(Continued)

OTHER PUBLICATIONS

International Search Report issued Feb. 10, 2015 in PCT/JP2014/081687 filed Dec. 1, 2014.

*Primary Examiner* — Theresa T Doan
(74) *Attorney, Agent, or Firm* — Oblon, McClelland, Maier & Neustadt, L.L.P.

(57) ABSTRACT

A power semiconductor device includes a first polarity-side semiconductor element whose first principal electrode is in contact with a first polarity-side surface electrode on an insulator plate; a second polarity-side semiconductor element whose first principal electrode is in contact with an intermediate surface electrode on the insulator plate; an intermediate conductor connecting the intermediate surface electrode with a second principal electrode of the first polarity-side semiconductor element; a heatsink being in contact with the insulator plate; a sealing resin sealing the first polarity-side semiconductor element, the second polarity-side semiconductor element, the insulator plate, and the intermediate conductor; a second polarity-side terminal of plate-type connected with a second principal electrode of the second polarity-side semiconductor element and extending
(Continued)

externally from the scaling resin; and an adjusting electrode mounted and connected to the heatsink so as to have a surface facing the second polarity-side terminal.

3 Claims, 8 Drawing Sheets

(51) Int. Cl.
*H01L 25/07* (2006.01)
*H01L 25/18* (2006.01)
*H01L 23/00* (2006.01)
*H01L 23/31* (2006.01)
*H02M 7/00* (2006.01)
*H01L 23/498* (2006.01)
*H02M 7/68* (2006.01)
*H01L 23/367* (2006.01)

(52) U.S. Cl.
CPC .... *H01L 23/3672* (2013.01); *H01L 23/49838* (2013.01); *H01L 24/36* (2013.01); *H01L 24/37* (2013.01); *H01L 24/40* (2013.01); *H01L 25/07* (2013.01); *H01L 25/18* (2013.01); *H02M 7/003* (2013.01); *H02M 7/68* (2013.01); *H01L 23/367* (2013.01); *H01L 2224/40139* (2013.01); *H01L 2224/40225* (2013.01); *H01L 2924/1203* (2013.01); *H01L 2924/1205* (2013.01); *H01L 2924/13055* (2013.01); *H01L 2924/13091* (2013.01); *H01L 2924/181* (2013.01); *H01L 2924/30105* (2013.01); *H01L 2924/30107* (2013.01)

(58) Field of Classification Search
USPC .......................................................... 257/717
See application file for complete search history.

(56) References Cited

FOREIGN PATENT DOCUMENTS

| | | |
|---|---|---|
| JP | 2010-251750 A | 11/2010 |
| JP | 2013-150488 A | 8/2013 |
| JP | 2013-182964 A | 9/2013 |

* cited by examiner

POWER SEMICONDUCTOR DEVICE

TECHNICAL FIELD

The present invention relates to power semiconductor devices for use in power conversion system for converting power from DC to AC or from AC to DC.

BACKGROUND ART

In most power semiconductor devices using power semiconductor elements, one side of the semiconductor element is in contact with a thin conductive-plate surface electrode formed on a surface of a thin insulator and the thin insulator is brought into contact with a metal heatsink, to ensure a cooling path for the semiconductor elements. Because of the fabrication process of semiconductor elements, it is common that the surface electrode is brought into contact with the collector side for cases with IGBTs, the drain side for cases with MOSFETs, and the cathode side for cases with diodes. For that reason, in a case of a power semiconductor device having a semi-bridge circuit configured with the upper-arm semiconductor element and the lower-arm semiconductor element connected in series, the positive polarity side of the semi-bridge circuit is brought into contact with the surface electrode. This creates a large stray capacitance between the positive polarity side and the heatsink. Since the negative polarity side of the semi-bridge circuit is, on the other hand, located away from the heatsink and in no contact with the surface electrode, a stray capacitance created between the negative polarity side and the heatsink is minute compared to that between the positive polarity side and the heatsink. Accordingly, the stray capacitance imbalance between the positive polarity-side and the negative polarity-side semiconductor elements and the heatsink increases noise, thus frequently causing an unwanted emission.

In order to deal with such a problem, for example, Patent Document 1 discloses a structure for in which both sides of each semiconductor element are covered with heatsinks and insulator plates are sandwiched between the heatsinks and metal patterns for the positive polarity-side and the negative polarity-side circuits to form capacitors, whereby the stray capacitances thereof are balanced to suppress noise.

In addition, there is disclosed another structure, in which an electrode electrically connected to heatsinks is disposed between wiring plates extending from the positive polarity-side terminal and the negative polarity-side terminal, to form capacitors between the electrode electrically connected to the heatsink and the positive and the negative polarity-side terminals, whereby the stray capacitances of the capacitors are balanced to suppress noise (refer to, for example, Patent Document 2).

PRIOR ART DOCUMENT

Patent Document

Patent Document 1: JP2013-150488 A
Patent Document 2: JP2010-251750 A

SUMMARY OF THE INVENTION

Problem that the Invention is to Solve

Since the power semiconductor device of Patent Document 1 is necessary to use heatsinks sandwiching the semiconductors for double sided cooling of the semiconductor elements through the positive polarity-side and the negative polarity-side metal patterns, the device is unsuitable to use a heatsink for single sided cooling.

Since the power semiconductor device of Patent Document 2 uses the wiring plates extending from the positive and the negative polarity-side terminals and from the semiconductor elements, the lengths of the wiring plates are inevitably long because of the structure of the device. This creates parasitic inductance, resulting in that the wiring plates are difficult to act as stray capacitors. Accordingly, noise is difficult to reduce.

The present invention is made to resolve such a problem as described above, and aimed at providing a power semiconductor device that is suitable to use a heatsink for single sided cooling and is capable of reducing parasitic inductance as low as possible and reducing noise effectively with a simple structure.

Means for Solving the Problem

The present invention provides a power semiconductor device that includes an insulator plate on one side of which a first polarity-side surface electrode and an intermediate surface electrode are formed; a first polarity-side semiconductor element whose first principal electrode is in contact with the first polarity-side surface electrode; a second polarity-side semiconductor element whose first principal electrode is in contact with the intermediate surface electrode; an intermediate conductor connecting the intermediate surface electrode with a second principal electrode of the first polarity-side semiconductor element; a heatsink being in contact with a surface of the insulator plate opposite to the surface on which the first polarity-side surface electrode is formed; a sealing resin sealing the first polarity-side semiconductor element, the second polarity-side semiconductor element, the insulator plate, and the intermediate conductor; a second polarity-side terminal of plate-type connected with a second principal electrode of the second polarity-side semiconductor element and extending externally from the sealing resin; and an adjusting electrode mounted to and connected with the heatsink so as to have a surface facing the second polarity-side terminal.

Advantages of the Invention

According to the present invention, there can be provided a power semiconductor device that is capable of reducing parasitic inductance as low as possible and of effectively suppressing noise with a simple structure.

EMBODIMENTS FOR CARRYING OUT THE INVENTION

Embodiment 1

Figure 1:
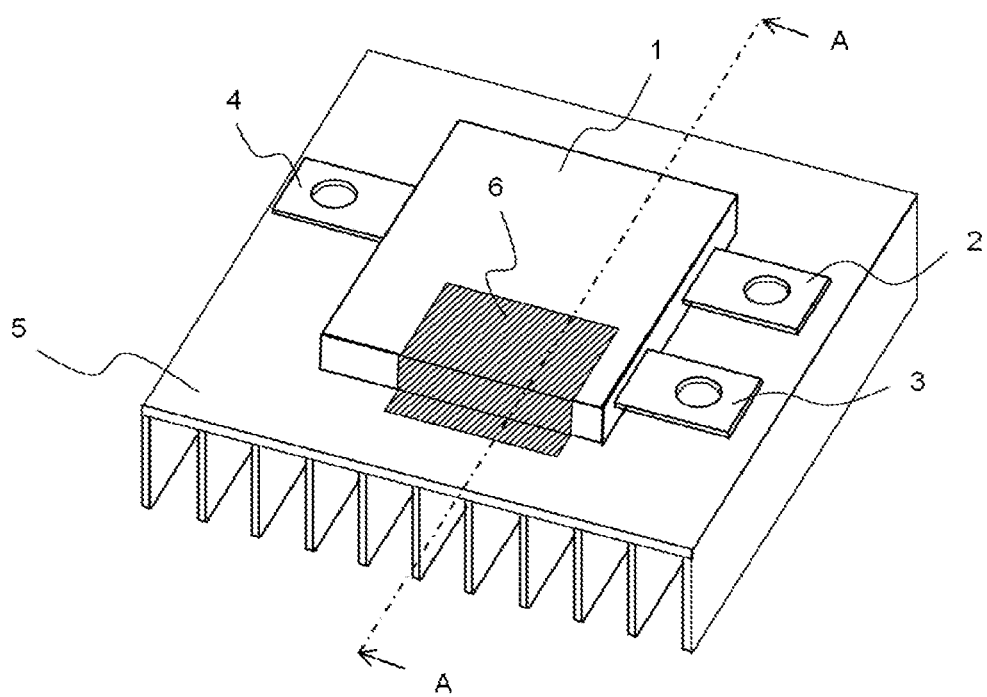
FIG. 1 is a perspective view showing a mounted state of a power semiconductor device according to Embodiment 1 of the present invention.
Figure 2:
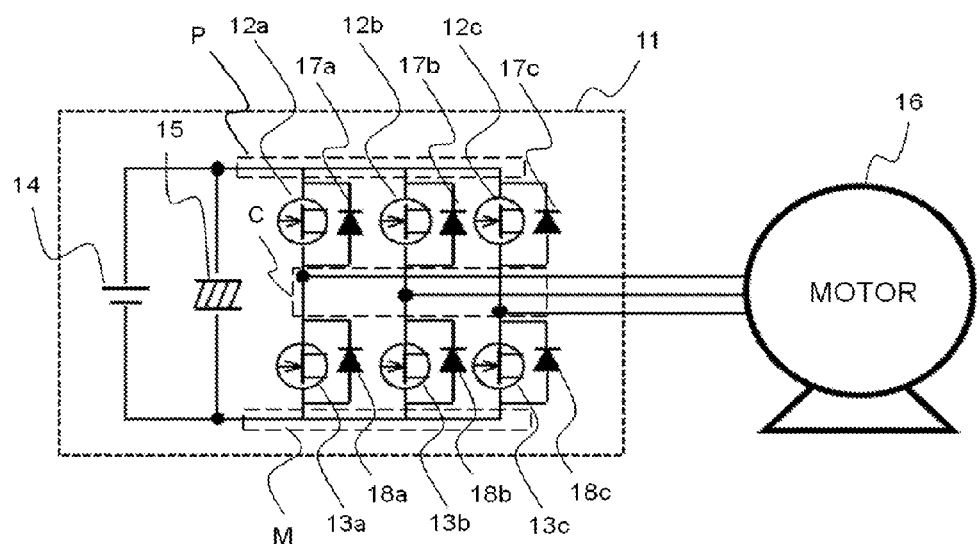
FIG. 2 is a circuit diagram showing an example of a power conversion system employing a power semiconductor device of the present invention.

FIG. 1 is a perspective view showing a mounted state of a power semiconductor device according to Embodiment 1 of the present invention. FIG. 2 is a circuit diagram showing an inverter as an example of a power conversion system employing a power semiconductor device of the present invention. It is assumed here that MOSFETs are used for the semiconductor elements. In FIG. 2, the power conversion system 11 includes upper-arm semiconductor elements 12a, 12b, 12c and lower-arm semiconductor elements 13a, 13b, 13c, and is configured such that the upper-arm semiconductor element 12a and the lower-arm semiconductor element 13a are connected in series; the upper-arm semiconductor element 12b and the lower-arm semiconductor element 13b are connected in series; and the upper-arm semiconductor element 12c and the lower-arm semiconductor element 13c are connected in series to form a first semi-bridge circuit, a second semi-bridge circuit, and a third semi-bridge circuit, respectively, and these semi-bridge circuits are connected in parallel. The upper-arm semiconductor elements 12a-12c are respectively connected in parallel with upper-arm diodes 17a-17c, and the lower-arm semiconductor elements 13a-13c are respectively connected in parallel with diodes 18a-18c. The drain side of the upper-arm semiconductor elements is connected to the positive polarity side (indicated by "P" in FIG. 2) of a DC power source 14 and a smoothing capacitor 15, and the source side of the lower-arm semiconductor elements is connected to the negative polarity side (indicated by "M" in FIG. 2) of the DC power source 14 and the smoothing capacitor 15. The connections between the upper-arm semiconductor elements and the lower-arm semiconductor elements (also referred to as "intermediate side" and indicated by "C" in FIG. 2) are connected to a motor 16.

While the circuit configuration of three parallel connected semi-bridge circuits is shown here, the present invention is applicable regardless of the number of parallel connected semi-bridge circuits. In addition, while a MOSFET is shown here as an example for the semiconductor element, the present invention is applicable to a case of using a semiconductor element such as an IGBT or a thyristor other than the MOSFET. In further addition, while an inverter is instanced here as the power conversion system, the present invention is applicable to a DC-DC converter circuit having semi-bridge circuits and a rectifier circuit having bridge-connected diodes. Note that in this specification, an electrode, such as the drain of MOSFET or the collector of IGBT, connected to the high voltage side are referred to as a positive principal electrode, and an electrode, such as the source of MOSFET or the emitter of IGBT, connected to the low voltage side are referred to as a negative principal electrode.

The power conversion system 11 is made up of semiconductor modules each composed of the semi-bridge circuit configured with the multiple semiconductors. The power semiconductor device shown in FIG. 1 according to Embodiment 1 of the present invention is configured with the one-phase serial connection of the upper-arm and the lower-arm semiconductor elements in FIG. 2. The semiconductor module 1 has a positive polarity-side terminal 2, a negative polarity-side terminal 3, and an intermediate terminal 4, and is mounted on a heatsink 5. Each terminal extends from the inside of the module. The semiconductor module further has an adjusting electrode 6 electrically connected with the heatsink 5 to form a capacitor between the adjusting electrode and the plate-type negative polarity-side terminal 3.

Figure 3:
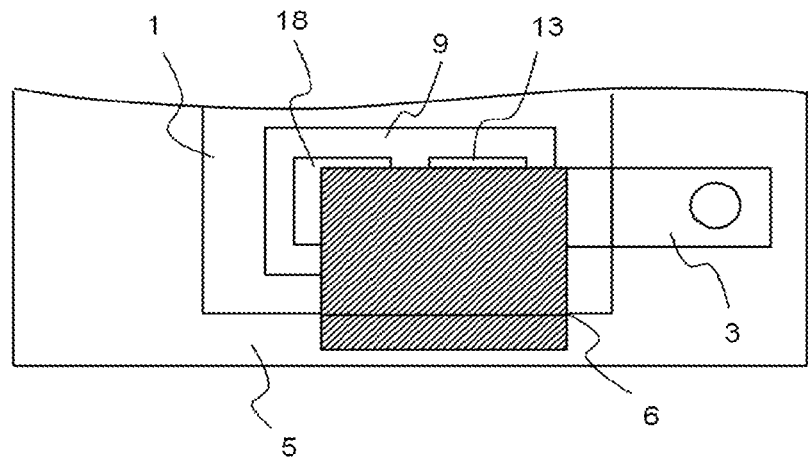
FIG. 3 is a top view showing an arrangement of the main portion of the power semiconductor device according to Embodiment 1.
Figure 4:
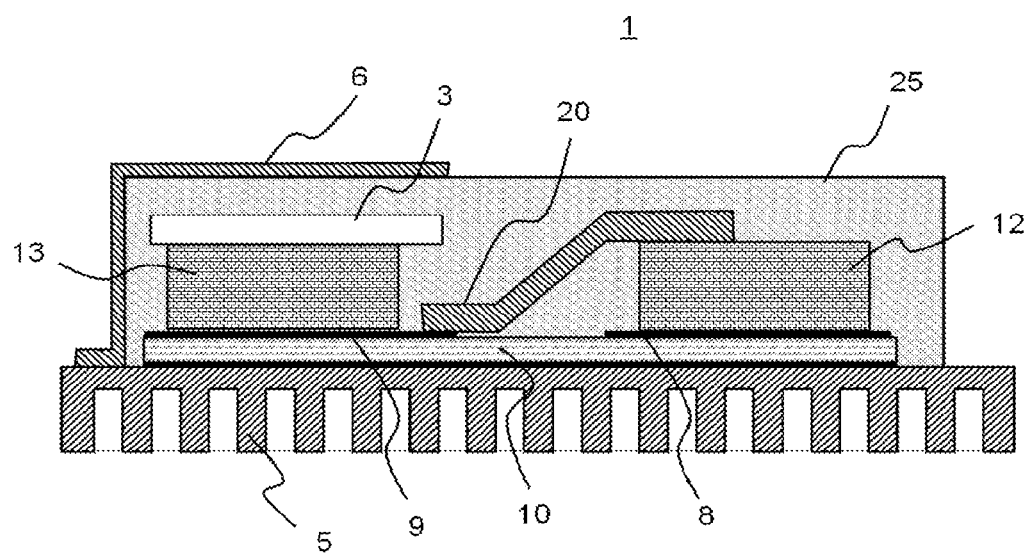
FIG. 4 is a side sectional view showing a structure of the power semiconductor device according to Embodiment 1.
Figure 5:
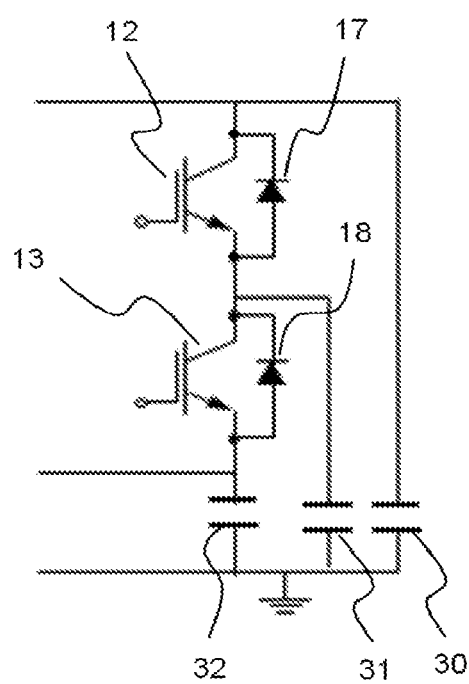
FIG. 5 is an equivalent circuit diagram for explaining operation of the power semiconductor device according to Embodiment 1.

FIG. 3 is a top view showing an internal arrangement of the main portion of the power semiconductor device according to Embodiment 1 of the present invention, in which only portion around the lower-arm semiconductor element 13 is shown, with a later described sealing resin 25 and an intermediate conductor 20 being removed. In FIG. 3 and the figures subsequent thereto, the upper-arm semiconductor element and the lower-arm semiconductor element are respectively expressed as a positive polarity-side semiconductor element 12 and a negative polarity-side semiconductor element 13. FIG. 4 is a sectional side view taking along the plane including A-A line in FIG. 1. FIG. 5 is an equivalent circuit diagram of the semi-bridge circuit of the power semiconductor device according to the present invention. As shown in FIG. 4, the positive principal electrode of the positive polarity-side semiconductor element 12 is in contact with the upper surface of the positive polarity-side surface electrode 8 and the positive principal electrode of the negative polarity-side semiconductor element 13 is in contact with the upper surface of the intermediate surface electrode 9. The positive polarity-side terminal 2 (not appear in FIG. 4) is connected to the positive polarity-side surface electrode 8; the negative polarity-side terminal 3 is connected to the negative principal electrode of the negative polarity-side semiconductor element 13; and the intermediate conductor 20 connects between the intermediate surface electrode 9 and the negative principal electrode of the positive polarity-side semiconductor element 12. The intermediate terminal 4 and the intermediate conductor 20 are electrically connected to each other. The positive polarity-side surface electrode 8 and intermediate surface electrode 9 are formed above one face of an insulator plate 10 and in thermal contact with the heatsink 5 via the insulator plate 10. In cases with power semiconductors, a surface electrode is generally brought into thermal contact with a heatsink via a thin insulator plate in this way to ensure a cooling path. In addition, since it is common that a positive principal electrode, i.e., the drain side for cases MOSFETs (the collector side for cases IGBTs, the cathode side for cases diodes) is brought into contact with a surface electrode because of the fabricating process of semiconductor elements, no negative polarity-side surface electrode is ordinarily formed on the surface of the insulator plate 10. The semiconductor module 1 is made up so that constituent members such as the semiconductor elements, the insulator plate, and the intermediate conductor, which are in contact with the respective surface electrodes, are sealed with the sealing resin 25.

The structure of the module creates a stray capacitance between the negative polarity-side terminal 3 and the adjusting electrode 6 electrically connected with the heatsink 5. While the adjusting electrode 6 may be connected with the heatsink 5 by soldering, the connection may be established such as by screw fastening or pressure joining without using soldering. A capacitor designated at 32 shown in the equivalent circuit diagram of FIG. 5 indicates a stray capacitance 32 (referred to as "adjustment stray capacitance") created by the adjusting electrode 6 and the negative polarity-side terminal 3. Also, a capacitor designated at 30 indicates a stray capacitance 30 (a positive polarity-side stray capacitance) created between the positive polarity-side surface electrode 8 and the heatsink 5. Further, a capacitor designated at 31 indicates a stray capacitance 31 (an intermediate side stray capacitance) created mainly by the heatsink 5 and the intermediate surface electrode 9 connected with the positive principal electrode of the negative polarity-side semiconductor element 13. The adjusting electrode 6 is mounted so that a capacitance of the capacitor 32, i.e., an adjustment stray capacitance 32 created by the adjusting electrode 6 and the negative polarity-side terminal 3 differs within, for example, ±10%, which is a capacitance allowance of typical capacitors, from the capacitance of the capacitor 30, i.e., the stray capacitance 30 created between the positive polarity-side surface electrode 8 and the heatsink 5.

Figure 6:
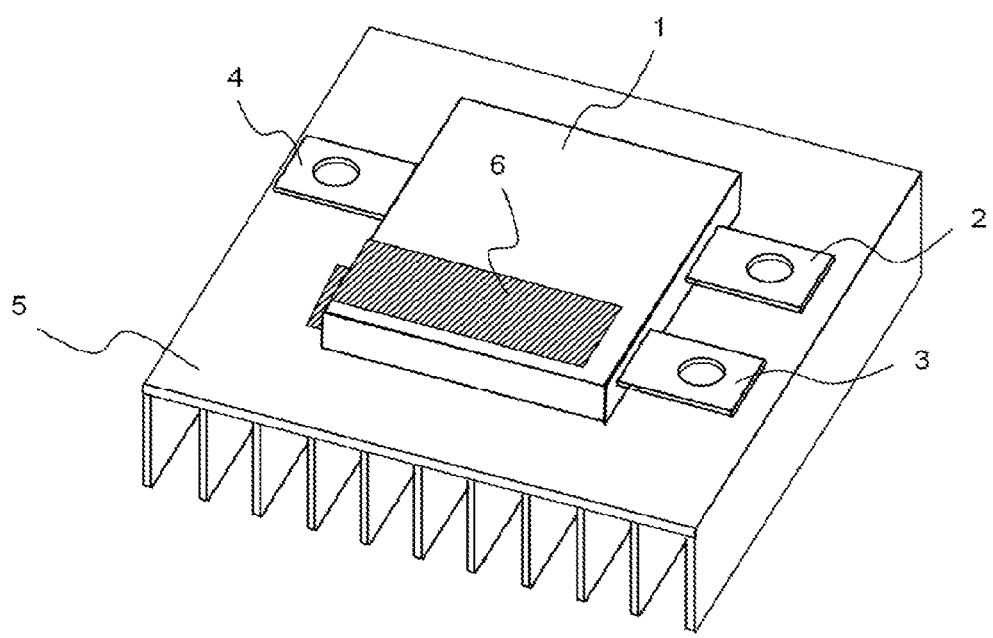
FIG. 6 is a perspective view showing a mounted state of the power semiconductor device having another structure according to Embodiment 1.

The structure shown in FIGS. 1 and 4 is such that the adjusting electrode 6 having a surface for facing the plate-type negative polarity-side terminal 3 to create the stray capacitance therebetween is mounted to and connected with the heatsink 5 along the lateral side of the semiconductor module 1, parallel to extending direction of the negative polarity-side terminal 3 and close to the negative polarity-side terminal 3. The adjusting electrode 6 may be mounted, but not limited to the above, extending from a lateral side opposite to the lateral side from which the negative polarity-side terminal 3 extends, so as to have a surface facing the negative polarity-side terminal 3, as shown in FIG. 6. Alternatively, the adjusting electrode 6 may be mounted extending from the lateral side from which the negative polarity-side terminal 3 extends, so as to have a surface facing the negative polarity-side terminal 3. Since a stray capacitance is thus created between the adjusting electrode 6 and the negative polarity-side electrode 3 by mounting and electrically connecting the adjusting electrode 6 to the heatsink 5 so as to have a surface facing the negative polarity-side electrode 3, an advantageous effect of the present invention can be brought about regardless of its width and thickness. In addition, the adjusting electrode 6 is preferably made to have the facing surface width equal to or wider than that of the negative polarity-side terminal 3. Making the adjusting electrode 6 to have such a width allows for low-inductance connection between the negative polarity-side terminal 3 and the heatsink 5, thus enhancing the advantageous effect of the present invention.

In Embodiment 1, the power conversion system 11 shown in FIG. 2 is made up of each semiconductor module 1 shown in FIG. 1 having the semi-bridge circuit, in which a capacitor is formed as the adjustment stray capacitance 32 between the negative polarity-side terminal 3 and the heatsink 5 by mounting the adjusting electrode 6 as shown in FIGS. 3, 4, and 6. The adjusting electrode 6 is mounted so that the adjustment stray capacitance 32 differs preferably within ±10% from the positive polarity-side stray capacitance 30 between the positive polarity-side surface electrode 8 and the heatsink 5. This balances the stray capacitances of the positive polarity side and the negative polarity side even in the structure employing the heatsink for single sided cooling, thus bringing about an effect of reducing radiated emission by the stray capacitances acting as capacitances for removing noise. Moreover, since the module uses no wiring plate extending from the negative polarity-side terminal, the structure of the module reduces parasitic inductance in comparison to the power semiconductor device disclosed in Patent Document 2. In this way, the stray capacitances of the positive polarity side and the negative polarity side are balanced without using additional parts other than the adjusting electrode, thus bringing about an effect of reducing radiated emission by the stray capacitances acting as capacitances for removing noise.

Embodiment 2

Figure 7:
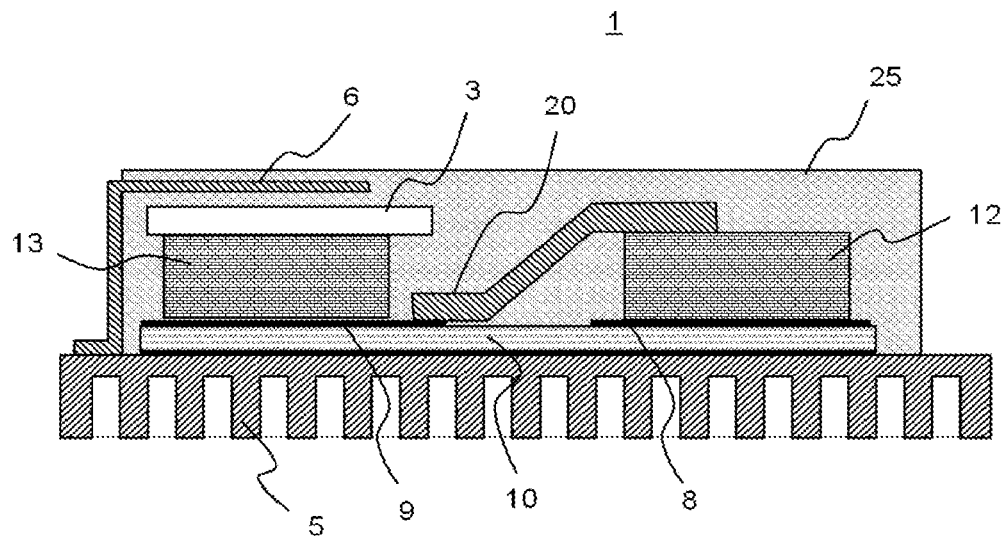
FIG. 7 is a side sectional view showing a structure of a power semiconductor device according to Embodiment 2 of the present invention.

FIG. 7 is a side sectional view showing a structure of a power semiconductor device according to Embodiment 2 of the present invention. The adjusting electrode 6 may be mounted covered partly with the sealing resin 25 as shown in FIG. 7. This structure can be fabricated in such a way that the adjusting electrode 6 is mounted only on the negative polarity side after the semiconductor module is filled with the sealing resin 25 up to the upper surface of the negative polarity-side terminal 3 and then the semiconductor module 1 is filled again with the sealing resin 25. While the adjusting electrode 6 shown in FIG. 7 is connected with the heatsink 5 along the lateral side of the semiconductor module 1, parallel to extending direction of the negative polarity-side terminal 3 and close to the negative polarity-side terminal 3, the adjusting electrode 6 may be mounted to and connected with the heatsink 5 along the lateral side from which the negative polarity-side terminal extends or along the lateral side from which the intermediate terminal 4 extends. The adjusting electrode 6 may be mounted to and connected with the heatsink 5 to have a surface facing the negative polarity-side terminal 3. While the adjusting electrode 6 may be connected with the heatsink 5 by soldering, the connection may be established such as by screw fastening or pressure joining without using soldering. The adjusting electrode 6 is mounted so that the stray capacitance 32 of the capacitor formed by the adjusting electrode 6 and the negative polarity-side terminal 3 differs within ±10%, which is a capacitance allowance of typical capacitors, from the positive polarity-side stray capacitance 30 created between the positive polarity-side surface electrode 8 and the heatsink 5.

Figure 8:
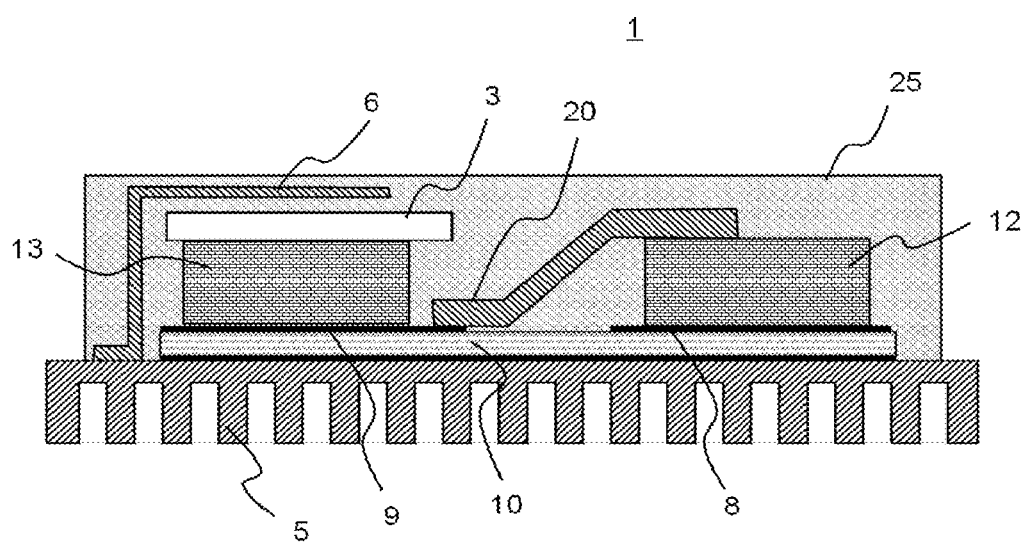
FIG. 8 is a side sectional view showing another structure of the power semiconductor device according to Embodiment 2.

FIG. 8 is a side sectional view showing another structure of the power semiconductor device according to Embodiment 2 of the present invention. The adjusting electrode 6 may be entirely covered with the sealing resin 25 as shown in FIG. 8. According to the structure of the power semiconductor device of Embodiment 2, since the adjusting electrode 6 can be mounted more closely to the negative polarity-side terminal 3 in comparison to the case of mounting the adjusting electrode 6 outside the semiconductor module 1 as with Embodiment 1, an adjusting electrode 6 of smaller area can balance the stray capacitances of the positive polarity side and the negative polarity side, thus bringing about an effect of reducing radiated emission by the stray capacitances acting as capacitances for removing noise.

Embodiment 3

Figure 9:
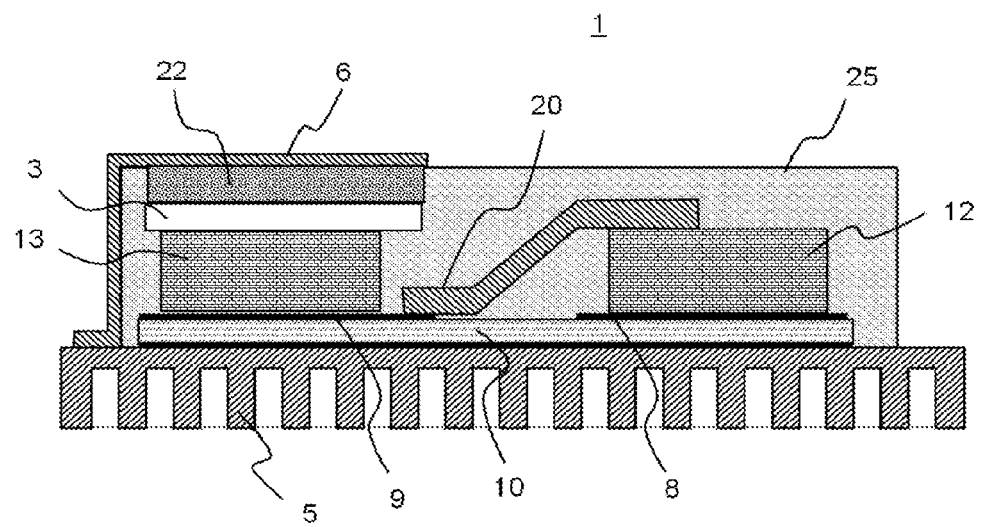
FIG. 9 is a side sectional view showing a structure of a power semiconductor device according to Embodiment 3 of the present invention.

FIG. 9 is a side sectional view showing a structure of a power semiconductor device according to Embodiment 3 of the present invention. A dielectric 22 having a permittivity different from that of the sealing resin 25 may be placed between the adjusting electrode 6 and the negative polarity-side terminal 3 as shown in FIG. 9. The dielectric 22 may be formed of, for example, barium titanate of high permittivity, or alumina, titanium oxide or calcium zirconate of low permittivity. This structure can be fabricated in such a way that the dielectric 22 separately formed is placed only on the negative polarity side after the semiconductor module is filled with the sealing resin 25 up to the upper surface of the negative polarity-side terminal 3 and then the semiconductor module 1 is filled again with the sealing resin 25. The adjusting electrode 6 may be connected with the heatsink 5 in any direction described in Embodiment 1 or 2. While the adjusting electrode 6 may be connected with the heatsink 5 by soldering, the connection in Embodiment 3 may also be established such as by screw fastening or pressure joining without using soldering. The adjusting electrode 6 is mounted so that the stray capacitance 32 of the capacitor formed by the adjusting electrode 6 and the negative polarity-side terminal 3 differs within ±10%, which is a capacitance allowance of typical capacitors, from the positive polarity-side stray capacitance 30 created by the positive polarity-side surface electrode 8 and the heatsink 5.

According to the structure, increase in permittivity of the dielectric 22 allows for reducing the area of the adjusting electrode 6 requiring to balance the stray capacitances of the positive polarity side and the negative polarity side in comparison to the case of filling the space between the adjusting electrode 6 and the negative polarity-side terminal 3 with the sealing resin 25 only, thus bring about an effect of reducing the radiated emission by the adjusting electrode 6 of smaller area.

Embodiment 4

Figure 10:
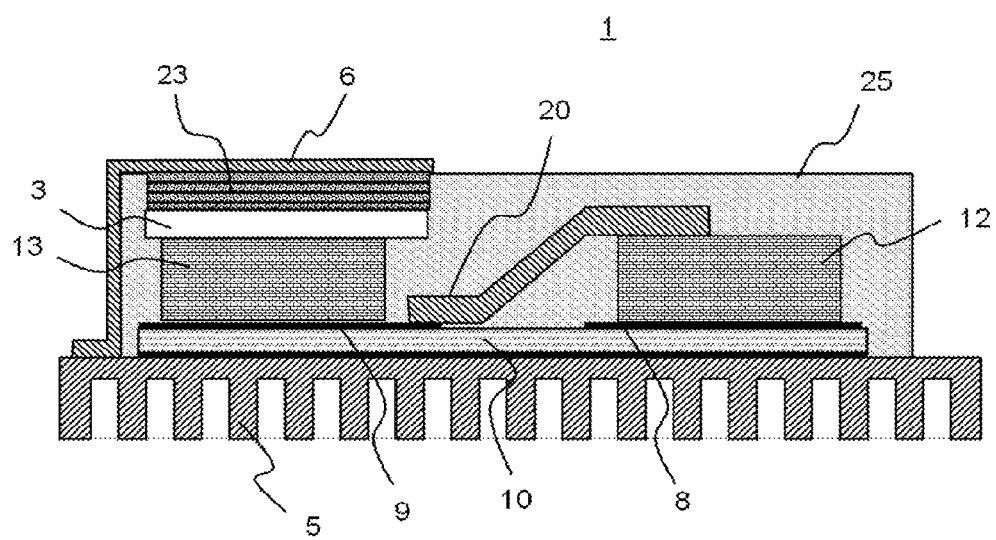
FIG. 10 is a side sectional view showing a structure of a power semiconductor device according to Embodiment 4 of the present invention.

FIG. 10 is a side sectional view showing the structure of a power semiconductor device according to Embodiment 4 of the present invention. A laminated structure 23 like a so-called multi-layer capacitor may be placed between the adjusting electrode 6 and the negative polarity-side terminal 3 as shown in FIG. 10, to create a stray capacitance by the adjusting electrode 6, the laminated structure 23 and the negative polarity-side terminal 3. This structure of the semiconductor module can be fabricated in such a way that the laminated structure 23 separately formed is placed only on the negative polarity side after the module is filled with the sealing resin 25 up to the upper surface of the negative polarity-side terminal 3 and then the semiconductor module 1 is filled again with the sealing resin 25. The adjusting electrode 6 may be connected with the heatsink 5 in any direction described in Embodiment 1 or 2. While the adjusting electrode 6 may be connected with the heatsink 5 by soldering, the connection may also be established such as by screw fastening or pressure joining without using soldering. The adjusting electrode is mounted so that the stray capacitance 32 of the capacitor formed by the adjusting electrode 6 and the negative polarity-side terminal 3 differs within ±10%, which is a capacitance allowance of typical capacitors, from the positive polarity-side stray capacitance 30 created by the positive polarity-side surface electrode 8 and the heatsink 5.

According to the structure of the module, placing of the laminated structure 23 allows for reducing the area of the adjusting electrode 6 requiring to balance the stray capacitances of the positive polarity side and the negative polarity side in comparison to the case of filling the space between the adjusting electrode 6 and the negative polarity-side terminal 3 with the sealing resin 25 only, thus, bringing about the effect of reducing radiated emission by the adjusting electrode 6 of smaller area.

Embodiment 5

In the above Embodiments 1 through 4, the semiconductor element designated at 12 and the semiconductor element designated at 13 are described as the upper-arm semiconductor element and the lower-arm semiconductor element, respectively. The present invention is also applicable to an inverse configuration. That is, the semiconductor element designated at 12 may be the lower-arm semiconductor element and the semiconductor element designated at 13 may be the upper-arm semiconductor element as shown in the equivalent circuit diagram of FIG. 11. In this case, the positive polarity side and the negative polarity side described in Embodiments 1 through 4 are entirely inverted. Replacing the term of "positive" with "first" and that of "negative" with "second" and reading the "first" as "negative" and the "second" as "positive", the descriptions in Embodiments 1 through 4 hold true for the configuration of the semiconductor element designated at 12 and the semiconductor element designated at 13 being the lower and the upper semiconductor elements, respectively.

Figure 11:
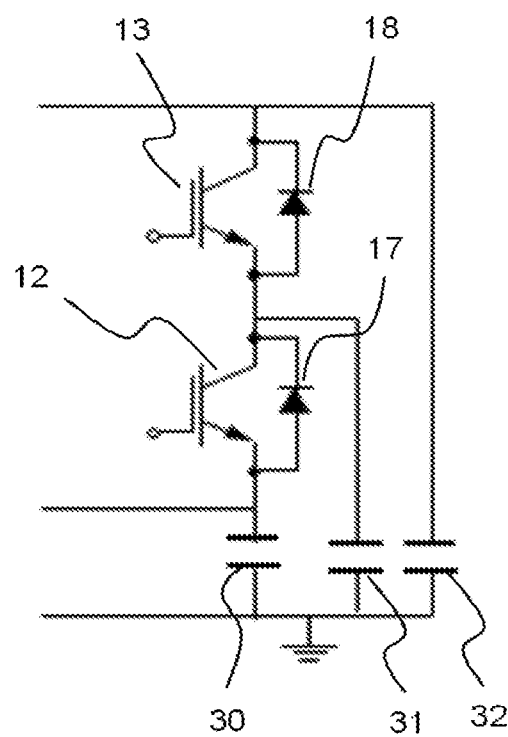
FIG. 11 is an equivalent circuit diagram for explaining operation of a power semiconductor device according to Embodiment 5 of the present invention.

Specifically, in any figures of FIGS. 1, 3, 4 and FIGS. 6-10, the constituent members are respectively expressed as a first polarity-side terminal 2, a second polarity-side terminal 3, a first polarity-side surface electrode 8, and a first polarity-side semiconductor elements 12 and a second polarity-side semiconductor elements 13, respectively. The case of the first polarity being positive and the second polarity being negative is described in Embodiments 1 through 4. In the case of the first polarity being negative and the second polarity being positive, on the other hand, the negative polarity-side semiconductor element is designated at 12; the polarity-side semiconductor element, at 13; and the positive polarity-side terminal, at 3. An equivalent circuit diagram of a power semiconductor device in this case is as shown in FIG. 11, in which the reference numerals "12", "13" of the serially connected semiconductor elements are opposite to those in the equivalent circuit diagram of FIG. 5. In this configuration, an adjustment stray capacitance created between the adjusting electrode 6 and the positive polarity-side terminal 3, i.e., the capacitance of the capacitor 32 in FIG. 11 is balanced with the stray capacitance (the negative polarity-side stray capacitance, the first polarity-side stray capacitance) between the negative polarity-side surface electrode 8 and the heatsink 5, i.e., the capacitance of the capacitor 30 in FIG. 11. Thus, the present invention is applicable regardless of polarity configuration of the semiconductor module 1.

It should be noted that each embodiment of the present invention may be freely combined or appropriately modified, or a constituent requirement of the embodiments may be omitted within the spirit and scope of the invention.

REFERENCE NUMERALS

1: semiconductor module;
2: positive polarity-side terminal (first polarity-side terminal);
3: negative polarity-side terminal (second polarity-side terminal);
4: intermediate terminal;
5: heatsink;
6: adjusting electrode;
8: positive polarity-side surface electrode (first polarity-side surface electrode);
9: intermediate surface electrode;
10: insulator plate;
11: power conversion system;

12, 12a-12c: upper-arm semiconductor element (positive polarity-side semiconductor element, first polarity-side semiconductor element);
13, 13a-13c: lower-arm semiconductor element (negative polarity-side semiconductor element, second polarity-side semiconductor element);
14: DC power source;
15: smoothing capacitor;
17, 17a-17c: upper-arm diode;
18, 18a-18c: lower-arm diode;
20: intermediate conductor;
22: dielectric 22;
23: laminated structure;
25: sealing resin;
30: positive polarity-side stray capacitance (first polarity-side stray capacitance);
31: intermediate side stray capacitance; and
32: adjustment stray capacitance.

The invention claimed is:

1. A power semiconductor device comprising:
an insulator plate on one side of which a first polarity-side surface electrode and an intermediate surface electrode are formed;
a first polarity-side semiconductor element whose first principal electrode is in contact with the first polarity-side surface electrode;
a second polarity-side semiconductor element whose first principal electrode is in contact with the intermediate surface electrode;
an intermediate conductor connecting the intermediate surface electrode with a second principal electrode of the first polarity-side semiconductor element;
a heatsink being in contact with a surface of the insulator plate opposite to the surface on which the first polarity-side surface electrode is formed;
a sealing resin sealing the first polarity-side semiconductor element, the second polarity-side semiconductor element, the insulator plate, and the intermediate conductor;
a second polarity-side terminal of plate-type connected with a second principal electrode of the second polarity-side semiconductor element and extending externally from the sealing resin; and
an adjusting electrode connected with the heatsink and mounted opposite the second polarity-side terminal with the sealing resin or a laminated structure with alternating conductive and dielectric layers being sandwiched between the adjusting electrode and the second polarity-side terminal.

2. The power semiconductor device of claim 1, wherein the adjusting electrode is mounted so that a value of a stray capacitance between the adjusting electrode and the second polarity-side terminal differs within 10% from a value of a stray capacitance between the first polarity-side surface electrode and the heatsink.

3. The power semiconductor device of claim 1, wherein at least part of the adjusting electrode is covered with the sealing resin.

* * * * *